United States Patent
Nara et al.

(10) Patent No.: US 11,454,372 B2
(45) Date of Patent: Sep. 27, 2022

(54) MIRROR UNIT AND LIGHT SOURCE DEVICE HAVING THE SAME

(71) Applicant: Ushio Denki Kabushiki Kaisha, Tokyo (JP)

(72) Inventors: Hideki Nara, Tokyo (JP); Yuichi Miura, Tokyo (JP); Takayuki Kozakura, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/169,877

(22) Filed: Feb. 8, 2021

(65) Prior Publication Data

US 2021/0285622 A1 Sep. 16, 2021

(30) Foreign Application Priority Data

Mar. 11, 2020 (JP) .............................. JP2020-041747

(51) Int. Cl.
    *F21V 17/10* (2006.01)
    *F21V 7/00* (2006.01)
    *F21Y 115/30* (2016.01)

(52) U.S. Cl.
CPC .......... *F21V 7/0066* (2013.01); *F21V 17/101* (2013.01); *F21Y 2115/30* (2016.08)

(58) Field of Classification Search
CPC .. H01L 23/3142; F21V 7/0025; F21V 7/0066; F21V 17/00; F21V 17/101; F21Y 2115/30
See application file for complete search history.

(56) References Cited

U.S. PATENT DOCUMENTS

| 7,185,992 B2 * | 3/2007 | Yoshizawa | G02B 7/026 359/507 |
| 2005/0122600 A1 * | 6/2005 | Yoshizawa | G02B 7/025 359/819 |
| 2011/0109713 A1 * | 5/2011 | Yamaguchi | G02B 26/10 347/224 |
| 2015/0226933 A1 * | 8/2015 | Sugita | G02B 7/026 359/829 |
| 2016/0102820 A1 * | 4/2016 | Chang | G02B 5/0816 362/84 |
| 2017/0051883 A1 * | 2/2017 | Raring | H01S 5/3203 |
| 2017/0063032 A1 * | 3/2017 | Morizumi | H01S 5/0087 |
| 2018/0182938 A1 * | 6/2018 | Miki | H01L 33/54 |

FOREIGN PATENT DOCUMENTS

| EP | 3086024 A2 * | 10/2016 | ................ F21V 5/04 |
| JP | 2011-076781 A | 4/2011 | |
| JP | 2017-62326 A | 3/2017 | |
| WO | WO-2011137361 A1 * | 11/2011 | ............ F21V 17/101 |

\* cited by examiner

*Primary Examiner* — Fatima N Farokhrooz
(74) *Attorney, Agent, or Firm* — Kenichiro Yoshida

(57) ABSTRACT

A mirror unit includes a plurality of reflective mirrors, a mirror holder on which the plurality of reflective mirrors are disposed and an adhesive member to bond and fix the reflective mirrors to the mirror holder. The mirror holder has a contact area where the reflective mirrors are to be in contact and a step in a direction away from the reflective mirror with respect to the contact area. The step has an adhesive fixing area on which an adhesive member is mounted.

9 Claims, 4 Drawing Sheets

MIRROR UNIT AND LIGHT SOURCE DEVICE HAVING THE SAME

TECHNICAL FIELD

The present invention relates to a mirror unit and a light source device having the mirror unit. The mirror unit has a plurality of mirrors arranged in parallel.

BACKGROUND ART

A conventional light source device is known to have semiconductor light emitting elements such as a plurality of semiconductor laser elements as a light source and a plurality of reflective mirrors arranged on the optical axis of the emitted light from the light source. In this light source device, a technology has been developed to reflect the emitted light at an interval narrower than that of the emitted light by shifting the position of each reflective mirror with respect to the direction parallel and perpendicular to the optical axis of the emitted light. (Refer to Patent Literature 1) This technology, which allows the interval of the reflected light to be narrower than that of the emitted light, enables a lens that focuses the reflected light to be smaller, leading to a compact light source device.

In the configuration of the Patent Literature 1, since the back surface of a strip-shaped reflective mirror is bonded to a mirror holder at a surface where they come into contact, there is an issue that the multiple reflective mirrors cannot maintain their parallelism. In other words, when the back surfaces of the reflective mirrors come into contact with the mirror holder via adhesives or the like, the reflective mirrors may be bonded with a slight tilt, which prevents each reflective mirror from being in parallel to each other, leading to the optical axis of the corresponding reflected light to be varied. Hence, in the Patent Literature 2, a mirror holder has a contact surface where the back surface of a reflective mirror to be in contact with, at an edge of the mirror holder to ensure parallelism for placing the reflective mirror, and has the other central part where adhesive is applied to fix the reflective mirror.

CITATION LIST

Patent Literature

Patent Literature 1: Japanese Patent Application Laid-Open Publication No. 2011-76781
Patent Literature 2: Japanese Patent Application Laid-Open Publication No. 2017-62326

SUMMARY OF INVENTION

Technical Problem

In Patent Literature 2, however, the adhesive may be gradually deteriorated by the small amount of the laser light transmitted through the reflective mirror, and the reflective mirror may fall off from the mirror holder in case the deterioration progresses.

An object of the present invention is to provide a mirror unit that maintains the parallelism of the reflective mirrors and prevents the reflective mirror from falling off because of the adhesive deterioration. The object of the present invention is also to provide a light source device having the mirror unit.

Solution to Problem

A mirror unit of the present invention includes a plurality of reflective mirrors, a mirror holder for disposing the reflective mirrors thereon, and an adhesive member for bonding and fixing the reflective mirrors to the mirror holder. The mirror holder has a plurality of contact areas where the reflective mirrors to be in contact, an adhesive fixing area where the adhesive member is provided, and a step in the direction away (concave) from the reflective mirror with respect to the contact area.

The mirror holder may have the one or more steps. The adhesive fixing area may be provided on a part or all of the one or more steps. The adhesive fixing area may be provided partially or entirely on the step. The step may be disposed (circumferentially) around the reflective mirror or the contact area in a continuous or intermittent (dashed) manner. The step may be an L-shape or a concave groove shape in a side view or a cross-sectional side view. The contact area may be composed of one flat surface, a plurality of flat surfaces with an equal height, and a plurality of protruding parts (convex parts) with an equal height. The contact area may have the step therein. The contact area may be disposed between the adhesive fixing areas that are apart from each other. The step may be formed at or around the edge of the contact area. The contact area may have a second adhesive fixing area where adhesive is provided (applied). The second adhesive fixing area may be disposed at an area of a lower height (more recessed than the surface) than that of a concave portion (including a groove and a hole) being disposed on the contact area or the surface where the reflective mirror is in contact. The contact area is preferably located on the opposite side (referred to "a back surface") of the reflective surface (referred to "a top surface") of the reflective mirror where the laser light is incident. The step is preferably located away from the back surface of the reflective mirror, since the laser light is incident on the reflective surface thereof.

The mirror holder may include a first adhesive member provided on the reflective surface of both ends of the reflective mirror in a longitudinal direction, a second adhesive member provided on the side surfaces of both ends of the reflective mirror in the longitudinal direction, and a third adhesive member provided on the step, to form an enclosing portion that covers both ends of the reflective mirror in the longitudinal direction.

The mirror holder may have a wall portion (e.g., a wall portion of which height is equal to or lower than that of the contact area) that stands from the step at a part or all of the peripheral ends of the reflective mirror that is placed on the mirror holder. Both ends of the reflective mirror in the longitudinal direction or transverse direction are the examples of a part of the peripheral ends of the reflective mirror that are placed on the mirror holder. The mirror holder may have a wall portion (a wall portion of which height is equal to or lower than that of the contact area) standing from the step, the wall portion being disposed at least either at both ends of the reflective mirror in the longitudinal direction or at both ends of the reflective mirror in the transverse direction. The mirror holder may have a recess formed on the wall portion and the step. Applying adhesive member to the recess prevents a leak from the step. The adhesive member with low viscosity can be used.

The wall portion may stand higher than the upper surface of the reflective mirror. The wall portion may be bonded with the adhesive member provided on the upper surface of the reflective mirror. This configuration allows the reflective mirror to fix more firmly and to be less likely to fall off, since the adhesive member is bonded between the upper surface of the reflective mirror and the wall portion at a position higher than the upper surface of the reflective mirror.

The adhesive member may be provided between a part or all of the side surfaces of the reflective mirror in the longitudinal direction or the transverse direction and the wall portion. This configuration allows the adhesive member to fill in between the side surface of the reflective mirror and the wall portion, thus further increasing the adhesive fixing force and improving the heat dissipation, thereby cooling the reflective mirror.

Among the outer surfaces of the mirror holder, at least a part of the surfaces where the adhesive member is disposed (applied) may be rougher than (a flat surface of) the contact area. The part where the adhesive member is disposed is formed with a roughened area, for example. The roughened area is formed, for example, by sandblasting and may have a surface roughness of about Ra25. The mirror holder may be made of casting metal, and a part of the contact surface where the adhesive member is disposed may be formed by a casting surface. The casting surface may have a surface roughness from Ra10 to Ra70, where Ra is the arithmetic mean roughness.

It is preferable that the adhesive member be a thermally conductive adhesive.

This configuration allows the heat of the reflective mirror to be transferred (exhausted) appropriately through the thermally conductive adhesive, thus improving the cooling performance.

The light source device of the present invention includes the mirror unit described above and a light source unit that emits light toward the reflective surface of the reflective mirror in the mirror unit. The light source unit may include a laser light or a fluorescent light. The present invention is particularly effective for a high intensity light.

Advantageous Effects of Invention

The mirror unit according to the present invention prevents a reflective mirror from falling off because of the deterioration of an adhesive member caused by laser light. Since the deterioration of the adhesive member is prevented, the parallelism of the reflective mirrors can be ensured.

DESCRIPTION OF EMBODIMENTS

Hereinafter, embodiments of the present invention will be described. The embodiments described below provide an example of the present invention. The present invention is not limited to the embodiments described below, but includes various modifications implemented to an extent that does not alter the gist of the present invention. It is noted that all of the configurations described below may not be essential to the present invention.

A mirror unit and a light source device according to the present invention will be described with reference to the drawings. It is noted that the dimensional ratios in each drawing do not necessarily match the actual dimensional ratios.

Exemplary Embodiment

Figure 1:
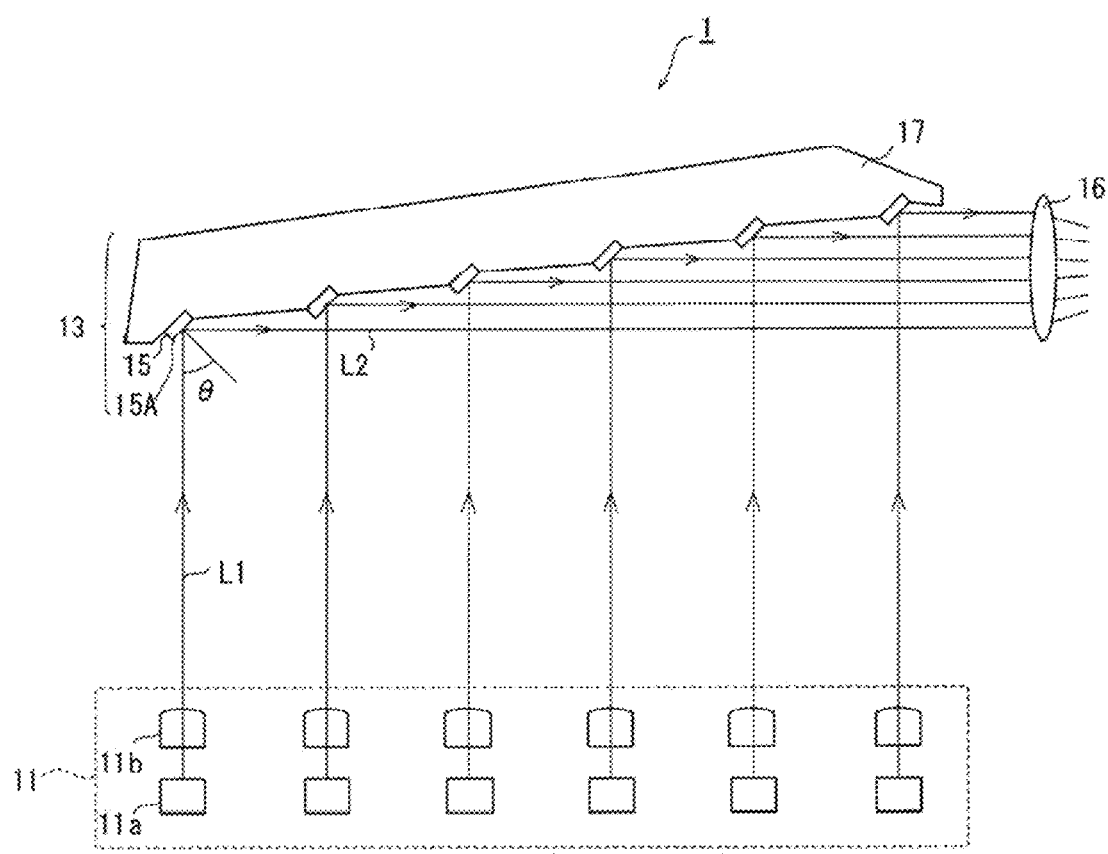
FIG. 1 is a schematic view of a light source device according to an exemplary device of the present invention.

With reference to FIG. 1, the exemplary device of a light source device 1 is described. As shown in FIG. 1, the light source device is provided with a light source unit 11 and a mirror unit 13.

The light source 11 includes a plurality of semiconductor laser elements 11$a$ that emit laser light, and a plurality of collimator lenses 11$b$ that convert the laser light from the semiconductor laser elements 11$a$ into collimated light.

Hereinafter, the laser light emitted from the semiconductor laser elements 11$a$ is referred to as the emitted light L1.

The semiconductor laser elements 11$a$ are arranged in rows and columns. The column direction is a vertical direction on the paper in FIG. 1, and the row direction is a direction orthogonal to the column direction and an optical axis of the emitted light L1 (transverse direction on the paper). In the present embodiment, as an example, the semiconductor laser elements 11a are arranged in four rows and six columns. The semiconductor laser elements 11a emit blue light (e.g., light with a wavelength of 430-470 nm). The light source unit 11 may be composed of semiconductor laser elements that emit light with a wavelength range different from that of blue light, LED devices, or any other solid-state light source elements.

The collimator lenses 11b each are arranged on the optical axis of the emitted light L1 from the corresponding semiconductor laser elements 11a. In other words, the number of the collimator lenses 11b arranged is same as that of the semiconductor laser elements 11a. The light source device 11 may not be provided with the collimator lenses 11b.

The mirror unit 13 includes a plurality of reflective mirrors 15 and a mirror holder 17.

The reflective mirror 15 reflects the emitted light L1, which is collimated by the collimator lens 11b, to the reflected light L2. The reflected light L2 is converged by a condenser lens 16 and emitted to the outside of the light source device 1 through various optical systems as necessary.

The number of the reflective mirrors 15 arranged is same as the number of columns of the semiconductor laser elements 11a. In other words, the semiconductor laser elements 11a arranged in the same column are reflected by the same reflective mirror 15. In the embodiment, six columns of semiconductor laser elements 11a and six reflective mirrors 15 are arranged. The reflective mirrors 15, for example, is a glass substrate having a metal film or a dielectric multilayer film with a high reflective property deposited on the substrate.

The mirror holder 17 supports each reflective mirror 15 positioned in parallel. The mirror holder 17 supports each reflective mirror 15 such that the normal direction of the reflective surface 15A of the reflective mirror 15 is set at a constant angle θ with respect to the emitted light L1. In the present embodiment, the mirror holder 17 supports the six reflective mirrors 15, for example, at an angle θ of 45 degrees.

The mirror holder 17 supports each reflective mirror 15 at a position where the reflective mirror 15 can reflect the emitted light L1 and the interval between the reflected light L2 is narrower than the interval between the emitted light L1. The mirror holder 17 is made of metal, for example, aluminum alloy. The mirror holder 17 may be manufactured by metal machining using commonly known machines such as NC milling machines and machining centers, or may be formed by casting.

Configuration of a Mirror Holder

Figure 2:
FIG. 2 is a schematic cross-sectional view of an overall mirror unit according to an exemplary embodiment of the present invention to conceptually illustrate the mirror unit holding a plurality of reflective mirrors.

With reference to FIG. 2, a mirror unit 13 of an exemplary embodiment according to the present invention is provided with a mirror holder 17 having a plurality of reflective mirrors 15 thereon. The mirror holder 17 of the exemplary embodiment is provided with a plurality of contact areas 170, each contact area 170 being provided for the corresponding reflective mirror 15 to be in contact with. The contact area 170 has a flat surface 171, which may coincide with the contact area 170 to ensure that each of the reflective mirrors 15 is arranged in parallel. The temperature of the reflective mirror 15 rises with the laser light irradiation, however, since the reflective mirror 15 and the mirror holder 17 are in contact with each other at the contact area 170, the heat associated with this temperature rise is transferred to the mirror holder 17 and is dissipated.

Figure 3A:
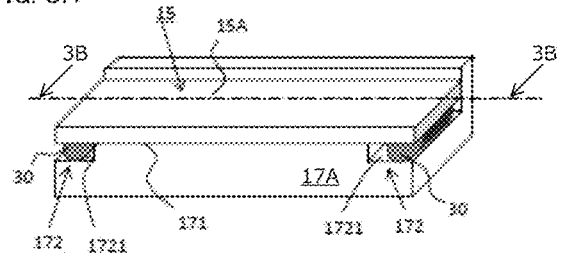
FIG. 3A is a schematic partially enlarged perspective view illustrating one of the reflective mirrors as indicated by dashed lined in FIG. 2 being bonded to a mirror holder according to a first embodiment of the present invention.
Figure 3B:
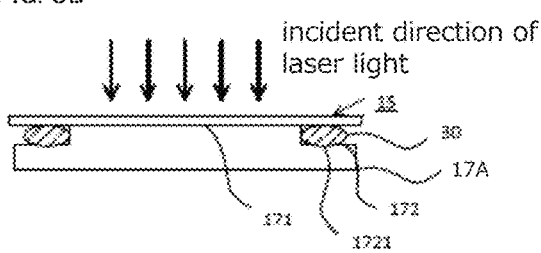
FIG. 3B is a schematic cross-sectional view taken along line 3B-3B in FIG. 3A.

FIG. 3A is a schematic partially enlarged view of a truncated portion 17A of the mirror holder 17 and one of the reflective mirrors 15 in an area indicated by the dashed lines in FIG. 2. FIG. 3B is a cross-sectional view taken along line 3B-3B in FIG. 3A. The mirror holder 17 is provided with steps 172 in the direction away (concave) from the reflective mirror 15 with respect to a flat surface 171 of the contact area 170. The steps 172 shown in FIG. 3A are provided at both ends of the reflective mirror 15 in the longitudinal direction; however, they are not limited to this configuration. The steps 172 may be provided along the peripheral end of the reflective mirror 15, or at both ends of the reflective mirror 15 in the transverse direction. As shown in FIG. 3B, the step 172 includes an adhesive fixing area 1721 to which an adhesive member 30 is applied. The reflective mirror 15 is fixed to the mirror holder 17 by applying the adhesive member 30 between the adhesive fixing area 1721 and the reflective mirror 15. The two opposite steps 172 (adhesive fixing areas 1721) are disposed separately to sandwich the contact area 170 (flat surface 171), and also to avoid the exposure of the laser light that slightly penetrates the reflective mirror 15. This configuration can suppress the deterioration of the adhesive member 30 caused by the laser light and prevent the reflective mirror 15 from falling off because of the deterioration.

In the present embodiment, the contact area 170 is positioned to be in contact with the opposite surface of a reflective area of the reflective mirror 15, the reflective area where the laser light being incident, and the two steps 172 (adhesive fixing areas 1721) are located away from the opposite surface of the reflective area; however the adhesive member 30 may also be applied to a part or all of the contact areas 170 other than the steps 172 or the recesses formed in the contact area 170. This configuration may similarly be employed in other embodiments. The reflective area may be a central part of the reflective surface 15A, excluding the end thereof.

Second Embodiment

Figure 4A:
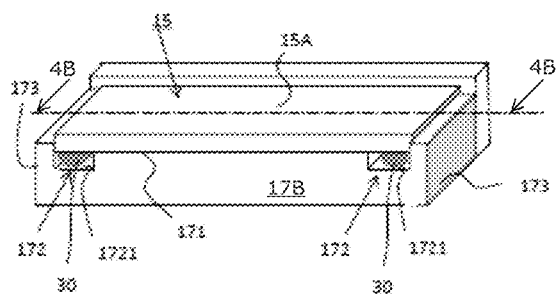
FIG. 4A is a schematic partially enlarged perspective view illustrating one of the reflective mirrors as indicated by dashed lined in FIG. 2 being bonded to a mirror holder according to a second embodiment of the present invention.
Figure 4B:
FIG. 4B is a schematic cross-sectional view taken along line 4B-4B in FIG. 4A.

FIGS. 4A and 4B are partially enlarged views illustrating a configuration of the mirror unit 13 according to the second embodiment. The same reference numerals refer to the same components as in the first embodiment. The following embodiments also follow this manner. A truncated portion 17B of the mirror holder 17 includes wall portions 173, each of which stands from the step 172 at both ends of the reflective mirror 15 in the longitudinal direction. In the present embodiment, the height of the wall portion 173 is higher than that of the contact area 170 and lower than that of the reflective surface 15A of the reflective mirror 15. The reflective mirror 15 is disposed between the two opposite wall portions 173, and both side surfaces of the reflective mirror 15 in the longitudinal direction are in contact with the surfaces of the wall portions 173. This configuration forms a concave portion with the step 172 and the wall portion 173 in the cross-sectional view (the view taken along line 4B-4B) of the reflective mirror 15 in the longitudinal direction, thus preventing the adhesive member 30 from leaking out of the step 172 before curing. This is particularly effective in using an adhesive member with low viscosity.

In another embodiment, the height of the wall portion 173 may be lower than that of the contact area 170 or higher than that of the reflective surface 15A of the reflective mirror 15.

Third Embodiment

Figure 5A:
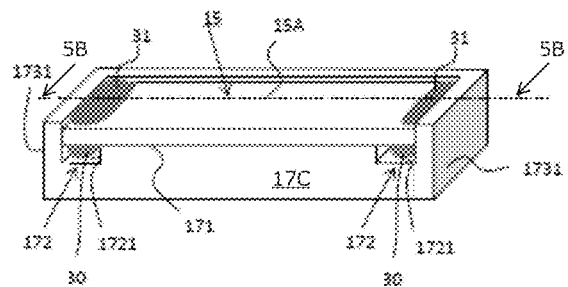
FIG. 5A is a schematic partially enlarged perspective view illustrating one of the reflective mirrors as indicated by dashed lined in FIG. 2 being bonded to a mirror holder according to a third embodiment of the present invention.
Figure 5B:
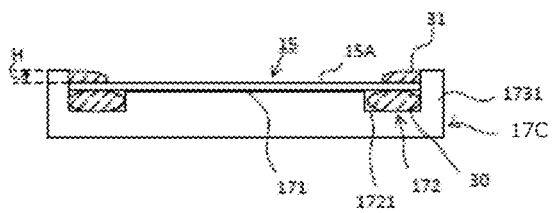
FIG. 5B is a schematic cross-sectional view taken along line 5B-5B in FIG. 5A.

FIGS. 5A and 5B are partially enlarged and truncated views illustrating a configuration of the mirror unit 13 according to the third embodiment. In the present embodiment, the height of two opposite wall portions 1731 is higher than that of the reflective surface 15A of the reflective mirror 15 by H. The reflective mirror 15 is disposed between the two opposite wall portions 1731, and both side surfaces of the reflective mirror 15 in the longitudinal direction are in contact with the surfaces of the wall portions 1731. The adhesive member 31 is then applied to the ends of the reflective surface of the reflective mirror 15, which is fixed to the surfaces of the wall portions 1731. Accordingly, the reflective mirror 15 can be fixed to a truncated portion 17C of the mirror holder 17 with the adhesive member 30 provided on the adhesive fixing area 1721, and with the adhesive member 31 provided on the reflective surface 15A of the reflective mirror 15.

Fourth Embodiment

Figure 6A:
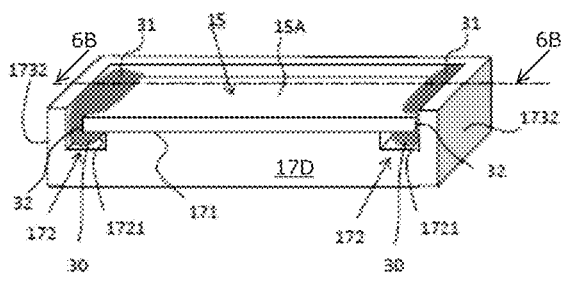
FIG. 6A is a schematic partially enlarged perspective view illustrating one of the reflective mirrors as indicated by dashed lined in FIG. 2 being bonded to a mirror holder according to a fourth embodiment of the present invention.
Figure 6B:
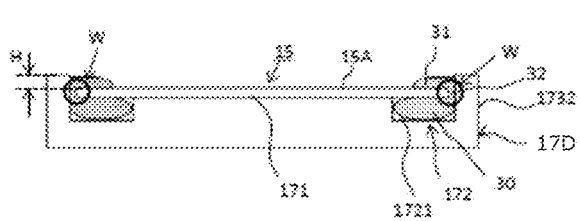
FIG. 6B is a schematic cross-sectional view taken along line 6B-6B in FIG. 6A.

FIGS. 6A and 6B are partially enlarged and truncated views illustrating a configuration of the mirror unit 13 according to the fourth embodiment. In the present embodiment, the height of the two opposite wall portions 1732 is higher than that of the reflective surface 15A of the reflective mirror 15 by H. The reflective mirror 15 is disposed between the two opposite wall portions 1732. There is a gap W between each of the wall portions 1732 and the corresponding side surface of the reflective mirror in the longitudinal direction, and adhesive member 32 is applied into the gap W. Accordingly, the reflective mirror 15 can be fixed to a truncated portion 17D of the mirror holder 17 with the adhesive member 30 provided on the adhesive fixing area 1721, with the adhesive member 31 provided on the reflective surface 15A of the reflective mirror 15, and with the adhesive member 32 provided in the gap W. This configuration allows the adhesive fixing force to increase further and the heat dissipation to improve for cooling the reflective mirror 15.

Fifth Embodiment

Figure 7A:
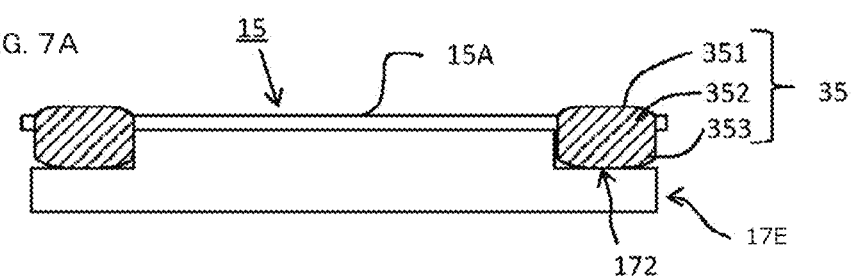
FIG. 7A is a schematic partially enlarged side view illustrating one of the reflective mirrors as indicated by dashed lined in FIG. 2 in a mirror unit according to a fifth embodiment of the present invention.
Figure 7B:
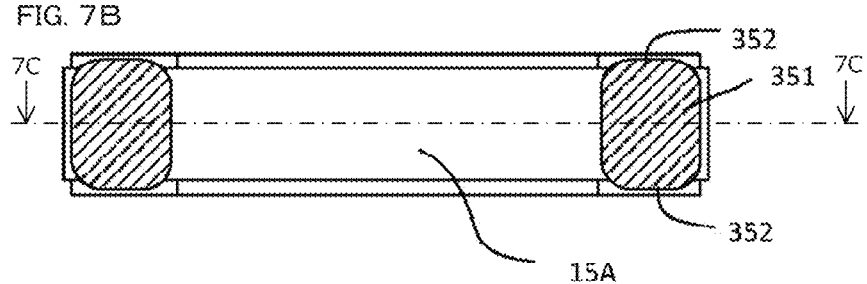
FIG. 7B is a schematic partially enlarged plan view illustrating the mirror unit according to the fifth embodiment of the present invention.
Figure 7C:
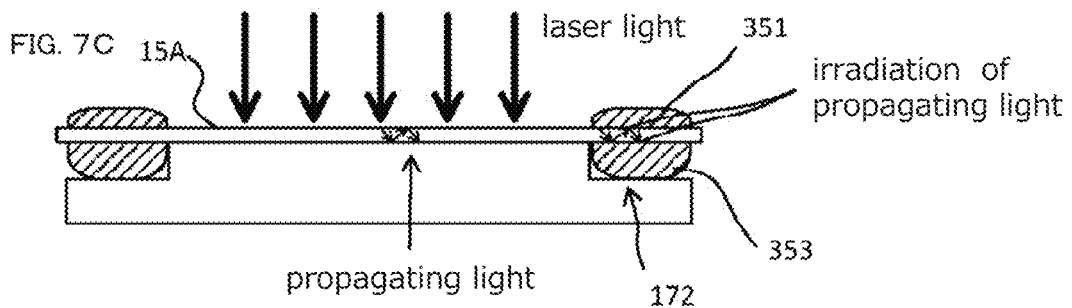
FIG. 7C is a schematic cross-sectional view taken along line 7C-7C in FIG. 7B.

FIGS. 7A, 7B and 7C are partially enlarged and truncated views (a side view(7A), a plan view(7B), and a cross-sectional view(7C)) illustrating a configuration of the mirror unit 13 according to the fifth embodiment. A truncated portion 17E of the mirror holder 17 according to the fifth embodiment has the steps 172 according to the first embodiment. A reduction on the adhesive strength of the adhesive member that has been applied to the surface being in contact with the reflective mirror 15 may be caused by, for example, the following factor that the light transmitted through the reflective mirror 15 propagates in the glass ("propagating light") and irradiates the area where the adhesive member is placed.

In the present embodiment, an enclosing portion 35 covering both ends of the reflective mirror 15 in the longitudinal direction is formed by a first adhesive member 351 provided on the reflective surface of both ends of the reflective mirror 15 in the longitudinal direction, a second adhesive member 352 provided on the side surfaces of both ends of the reflective mirror 15, and a third adhesive member 353 provided on the steps 172, thus fixing the reflective mirror 15 to the mirror holder 17.

This configuration prevents the reflective mirror 15 from falling off, even if the adhesive members (the first adhesive member 351, the second adhesive member 352) are deteriorated by the propagating light, since the enclosing portion 35 holds the reflective mirror 15 and the third adhesive member 353 is bonded to the step 172.

In another embodiment, the enclosing portion 35 may be provided instead of the adhesive members 30, 31 according to the second, the third and the fourth embodiments.

Sixth Embodiment

Figure 8:
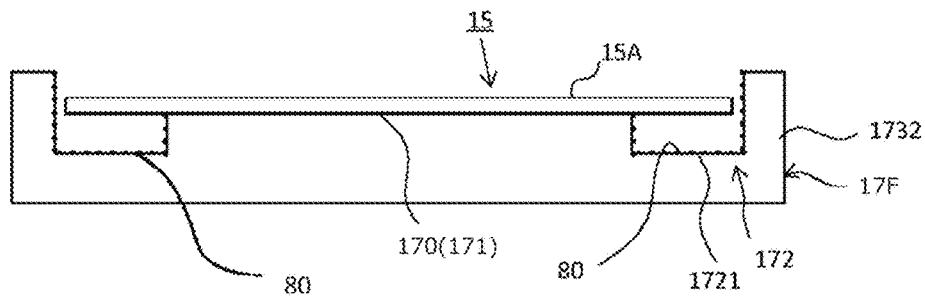
FIG. 8 is a schematic partially enlarged view illustrating one of the reflective mirrors as indicated by dashed lined in FIG. 2 in a mirror unit according to a sixth embodiment of the present invention.

FIG. 8 is a partially enlarged and truncated view illustrating a configuration of the mirror unit 13 according to the sixth embodiment. A truncated portion 17F of the mirror holder 17 according to the sixth embodiment has the steps 172 and the wall portions 1732 according to the fourth embodiment. A roughened area 80 is formed on the surfaces of the steps 172 and the wall portions 1732 where an adhesive member is to be in contact. The roughened area 80 is formed by sandblasting, for example, and has a surface roughness of about Ra25. In the present embodiment, the mirror holder 17 is manufactured through aluminum die casting, and has a roughness of casting surface, hence the casting surface may serve as the roughened area 80. The adhesive member provided on the roughened area 80 has an anchoring effect that improves adhesive properties. Among the outer surfaces of the mirror holder 17, the contact area 170 (flat surface 171) may have a smooth surface, for example, with a surface roughness of about Ra 1.6, to improve contact with the back surface of the reflective mirror 15.

In another embodiment, the roughened area 80 may be formed in the area where the adhesive member is provided (applied) according to the other embodiments. The roughened area may be formed on the reflective mirror 15 where the adhesive member is in contact, in addition to the mirror holder 17.

Seventh Embodiment

Figure 9A:
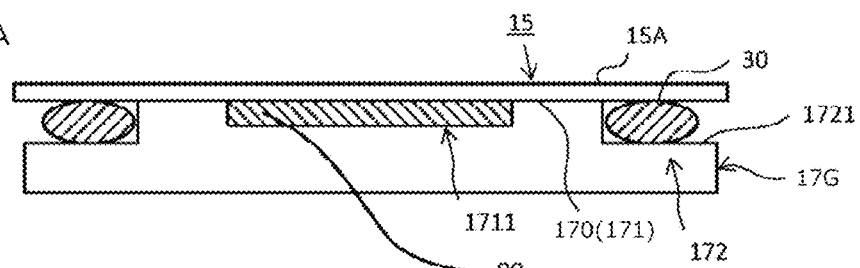
FIG. 9A is a schematic partially enlarged view illustrating one of the reflective mirrors as indicated by dashed lined in FIG. 2 in a mirror unit according to a seventh embodiment of the present invention.
Figure 9B:
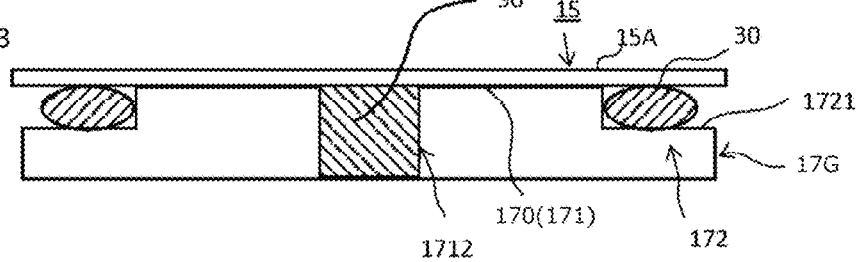
FIG. 9B is a schematic partially enlarged view illustrating the mirror unit according to the seventh embodiment of the present invention.

FIGS. 9A and 9B are partially enlarged and truncated views illustrating a configuration of the mirror unit 13 according to the seventh embodiment. A truncated portion 17G of mirror holder 17 according to the seventh embodiment has the steps 172 according to the first embodiment. In the present embodiment, the contact area 170 (flat surface 171) is provided with a recess 1711 (FIG. 9A) or a through hole 1712 (FIG. 9B), and a heat transfer member 90 is filled in the recess 1711 or the through hole 1712. The reflective mirror 15 can be cooled more effectively by contacting the heat transfer member 90 with the reflective mirror 15. Examples of the heat transfer member 90 include thermal grease.

In another embodiment, the recess 1711, the through hole 1712 or the heat transfer member 90 may be provided on the contact area 170 (flat surface 171) according to the other embodiments.

Eighth Embodiment

In the eighth embodiment, a thermally conductive adhesive is employed as the adhesive member according to the above-mentioned embodiment. The thermally conductive adhesive can suitably transfer (dissipate) the heat from the reflective mirror, thus improving the cooling performance. Examples of the thermally conductive adhesives include thermally conductive thermosetting adhesive, thermally conductive epoxy adhesive, and heat dissipative curing silicone.

Ninth Embodiment

Figure 10A:
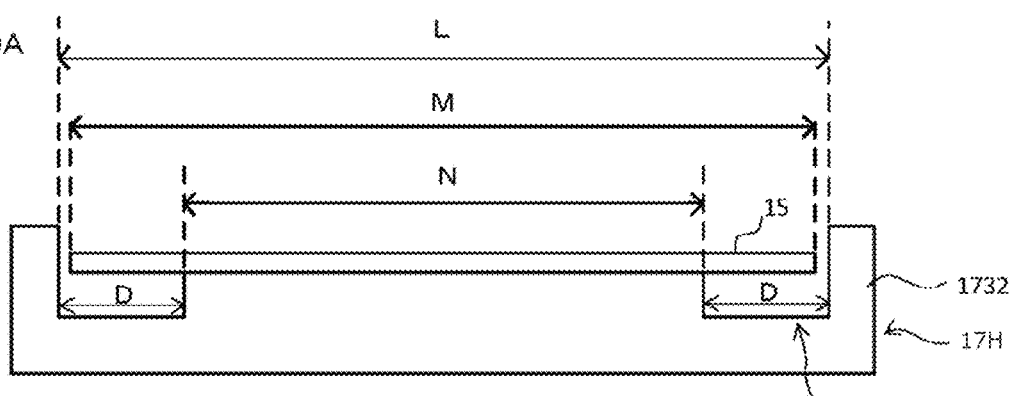
FIG. 10A is a schematic view illustrating one of the reflective mirrors as indicated by dashed lined in FIG. 2 in a mirror unit according to a ninth embodiment of the present invention.
Figure 10B:
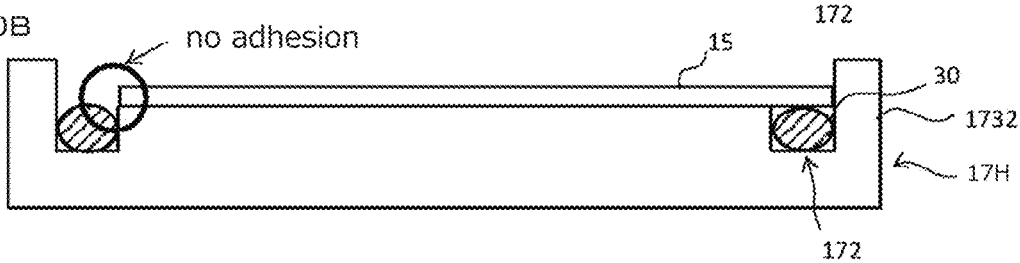
FIG. 10B is a schematic view illustrating the mirror unit according to the ninth embodiment of the present invention.

FIGS. 10A and 10B are views illustrating a configuration of the mirror unit 13 according to the ninth embodiment. A truncated portion 17H of the mirror holder 17 according to the ninth embodiment has the steps 172 and wall portions 1732 according to the fourth embodiment. In the present embodiment, the following relation is satisfied.

$$(L-M):(M-N)=1:1.1\sim1:60 \quad \text{(Equation 1)}$$

In this equation, L is denoted as the length from one wall portion 1732 to the other (the width between the surfaces of wall portions 1732, each surface facing the side surface of the reflective mirror 15 in the longitudinal direction), M is denoted as the length of the reflective mirror 15 in the longitudinal direction, and N is denoted as the length from one step 172 to the other step 172 (the length from one end of the flat surface 171 to the other end).

When machining accuracy is taken into account, satisfying this relation enables both ends of the reflective mirror 15 in the longitudinal direction to be in contact with the adhesive member 30, even if the reflective mirror 15 happens to be disposed unevenly between the two opposite wall portions 1732, hence the reflective mirror is fixed more firmly. In other words, both ends of the reflective mirror 15 are ensured to be firmly fixed with the adhesive member. This configuration prevents, for example, the problem that one side of the reflective mirror 15 (the left end on the paper) cannot be bonded because of the uneven placement, shown in FIG. 10B.

The following relations are satisfied.

$$(L-N)/2=D \quad \text{(Equation 2)}$$

$$(N+D)<M<L \quad \text{(Equation 3)}$$

In these equations, L, M, and N are denoted as described above, and D is denoted as the length of the step 172. Satisfying the Equation 2 and Equation 3 prevents the problem that one side of the reflective mirror 15 (the left end on the paper) cannot be bonded because of the uneven placement, shown in FIG. 10B.

REFERENCE SIGNS LIST 1 light source device
11 light source unit
11a semiconductor laser element
11b collimator lens
13 mirror unit
15 reflective mirror
15A reflective surface
16 condenser lens
17 mirror holder
170 contact area
171 flat surface
172 step
1721 adhesive fixing area
173, 1731, 1732 wall portion
30, 31, 32 adhesive member
35 enclosing portion
351 first adhesive member
352 second adhesive member
353 third adhesive member
80 roughened area
90 thermally conductive member
L1 emitted light
L2 reflected light
W gap

What is claimed is:

1. A mirror unit comprising:
   a plurality of reflective mirrors, each of the reflective mirrors having side surfaces and a reflective surface with peripheral ends, the reflective surface being configured to allow light to be incident;
   a mirror holder having outer surfaces for disposing the reflective mirrors thereon; and
   an adhesive member forming an enclosing portion including a first adhesive member and a third adhesive member for bonding and fixing the reflective mirrors to the mirror holder,
   wherein the mirror holder further includes a plurality of contact areas where a substantial portion of each of the reflective mirrors is in direct contact with a corresponding one of the contact areas without the adhesive member for support and heat dissipation, and
   an adhesive fixing area of the mirror holder located along at least one peripheral end of each of the reflective mirrors, the enclosing portion being formed by the first adhesive member provided on the reflective surface of both ends of the reflective mirror in the longitudinal direction and the third adhesive member provided on the adhesive fixing area of the mirror holder for bonding the reflective mirror to the adhesive fixing area of the mirror holder.

2. The mirror unit according to claim 1, wherein the enclosing portion being further formed by a second adhesive member provided on the side surfaces of both ends of the reflective mirror in the longitudinal direction.

3. The mirror unit according to claim 1, wherein the mirror holder includes a wall portion that stands from the adhesive fixing area, the wall portion being disposed at least either at both ends of the reflective mirror in the longitudinal direction or at both ends of the reflective mirror in the transverse direction.

4. The mirror unit according to claim 1, wherein among the outer surfaces of the mirror holder, at least a portion on which the adhesive member being disposed is rougher than the contact area.

5. The mirror unit according to claim 1, wherein the adhesive member is a thermally conductive adhesive.

6. A light source device comprising:
   a mirror unit according to claim 1; and
   a light source unit for emitting light toward the reflective surface of the reflective mirror in the mirror unit.

7. The mirror unit according to claim 3, wherein the height of the wall portion is higher than that of the reflective surface of the reflective mirror, and the wall portion is bonded with the adhesive member provided on the reflective surface of the reflective mirror.

8. The mirror unit according to claim 3, wherein the adhesive member is provided between a part or all of the side surfaces of the reflective mirror in the longitudinal or transverse direction and the wall portion.

9. A mirror unit comprising:
   a plurality of reflective mirrors, each of the reflective mirrors having a reflective surface with peripheral ends, the reflective surface being configured to allow light to be incident;

an adhesive member forming an enclosing portion including a first adhesive member and a second adhesive member for bonding the reflective mirrors,
a mirror holder having a plurality of contact areas each with a flat surface for directly placing each of the reflective mirrors without the adhesive member on the flat surface for support and heat dissipation;
wherein the mirror holder further includes a step whose portion located along and under at least one of the peripheral ends of each of the reflective mirrors when the reflective mirror is placed on the flat surface, the step further including an adhesive fixing area of the mirror holder, an enclosing portion being formed by the first adhesive member provided on the reflective surface of both ends of the reflective mirror in the longitudinal direction and the second adhesive member provided on the adhesive fixing area of the mirror holder for bonding the reflective mirror to the adhesive fixing area of the mirror holder.

\* \* \* \* \*